United States Patent [19]

Mazzochette

[11] Patent Number: 5,598,131
[45] Date of Patent: Jan. 28, 1997

[54] AC COUPLED TERMINATION

[75] Inventor: Joseph B. Mazzochette, Cherry Hill, N.J.

[73] Assignee: EMC Technology, Inc., Cherry Hill, N.J.

[21] Appl. No.: 558,394

[22] Filed: Nov. 16, 1995

[51] Int. Cl.$^6$ ..................................................... H01P 1/26
[52] U.S. Cl. ........................... 333/22 R; 333/172; 361/766
[58] Field of Search ................................. 333/22 R, 172; 361/765, 766

[56] References Cited

U.S. PATENT DOCUMENTS

| | | | |
|---|---|---|---|
| 2,989,665 | 6/1961 | Khouri | 361/765 |
| 3,443,311 | 5/1969 | Worobey . | |
| 3,665,346 | 5/1972 | Orr . | |
| 3,949,275 | 4/1976 | Muenz . | |
| 4,020,222 | 4/1977 | Kausche et al. . | |
| 4,024,478 | 5/1977 | Wolfe | 333/22 R X |
| 4,720,766 | 1/1988 | Honda . | |
| 5,420,533 | 5/1995 | Sakamoto et al. | 333/172 |
| 5,541,564 | 7/1996 | Climer et al. | 333/172 |

FOREIGN PATENT DOCUMENTS

| | | | |
|---|---|---|---|
| 335812 | 12/1993 | Japan | 333/22 R |
| 152206 | 5/1994 | Japan | 333/22 R |
| 1086484 | 4/1984 | U.S.S.R. | 333/22 R |

Primary Examiner—Paul Gensler
Attorney, Agent, or Firm—Donald S. Cohen

[57] ABSTRACT

The present invention is directed to an AC termination which includes a substrate having first and second surfaces. A resistor is mounted on the first surface of the substrate. An input termination is at one end of the resistor. At least one plate of a capacitor is on the substrate and is electrically connected in series with the other end of the resistor. In one form of the termination, the capacitor is a metal film on the substrate extending from the other end of the resistor to and across the second surface of the substrate to form one electrode of the capacitor. A dielectric layer is over the metal film and another metal film extends over the dielectric layer to form the other electrode of the capacitor and the output termination of the termination. In another form of the termination, the capacitor is formed on a cover plate which extends over the first surface of the substrate and is electrically connected between the resistor and an output termination. In still another form of the termination, the substrate is of a conductive metal and forms one electrode of the capacitor, and a layer of a dielectric material extends over the second surface of the substrate.

11 Claims, 1 Drawing Sheet

5,598,131

AC COUPLED TERMINATION

FIELD OF THE INVENTION

The present invention is directed to an AC coupled termination, and, more particularly, to such a termination which includes a capacitor coupled to a termination resistor.

BACKGROUND OF THE INVENTION

High power loads are often used as terminations on the isolated port of a circulator. The circulator then becomes an isolator which can be used to protect transmitters and receivers from damage due to reflected signals. Such signals are ported to the termination on the isolator where they are absorbed. Some isolator applications also include DC bias currents superimposed on the RF line. The bias does not present a problem for the circulator. However, the circulator termination will sink the bias current. This sinking results in unnecessary continuous DC power consumption, and requires that the termination be rated to absorb the additional energy. One solution to this problem is to include a blocking capacitor in series with the termination. The capacitor passes the RF signal to the load, but not the DC bias.

Blocking capacitors may be connected to the loads in a variety of configurations. Most require the purchase of an additional part, accommodation on the circuit board or housing for the part, and finally the labor required for the installation of the part. If the capacitor can be incorporated into the load without adding significantly to the load cost, then much of the cost associated with the additional part can be saved. The capacitor must have a breakdown voltage suitable for the application, and must operate as a low impedance device over the frequency of operation of the circulator. If the termination is constructed so that the capacitor is situated between the load and the RF ground, then the breakdown voltage requirement for the RF signal is low.

SUMMARY OF THE INVENTION

The present invention is directed to an AC coupled termination which includes a substrate of an insulating material having first and second opposed surfaces and a peripheral edge. A conductive input termination is on the first surface of the substrate and a conductive output termination is on the second surface of the substrate. A resistance element is on the first surface of the substrate and has a pair of ends, one of which is electrically connected to the input termination. A capacitor is on the substrate and electrically connected in series between the other end of the resistance element and the output termination.

The present invention is also directed to an AC coupled termination which includes a substrate of an electrically conductive metal having first and second opposed surfaces. A resistor is mounted on the substrate at the first surface and is electrically connected at one end to the substrate. A layer of a dielectric material is over the second surface of the substrate.

DETAILED DESCRIPTION

Figure 1:
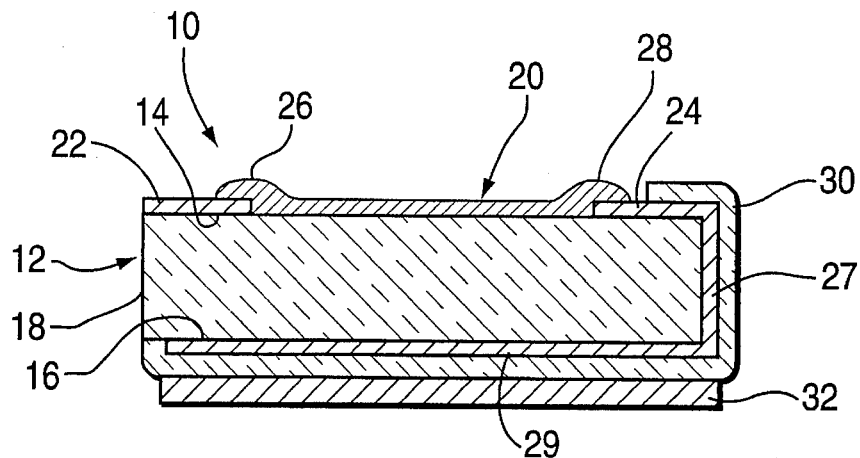
FIG. 1 is a sectional view of one form of the AC coupled termination of the present invention.

Referring initially to FIG. 1, one form of the AC termination of the present invention is generally designated as 10. Termination 10 comprises a substrate 12 of an insulating material, such as a ceramic, having first and second opposed surfaces 14 and 16 and an outer edge 18. A resistor element 20 is on the first surface 14 of the substrate 12. The resistance element 20 is a film of any desired resistance material, such as a thin metal film or a thick film of metal particles in a glass. Also on the first surface 14 of the substrate 12 are first and second spaced terminations 22 and 24. The terminations 22 and 24 are films of any desired conductive metal. The first termination 22 is adjacent one end 26 of the resistance element 20 which overlaps and makes ohmic contact with the termination 22. The second termination 24 is adjacent another end 28 of the resistance element which overlaps and makes ohmic contact with the termination 24. The second termination 24 has a portion 27 which extends across the outer edge 18 of the substrate 20 and another portion 29 which is over the second surface 16 of the substrate 20. A layer 30 of a dielectric material extends over the portions 27 and 29 of the second termination 24. An output termination 32 of a layer of a conductive metal extends over the portion of the dielectric layer 30 which is over the second surface 16 of the substrate 12.

In the termination 10, the first termination 22 serves as the input terminal for the termination 10, and the output termination 32 serves as the output terminal for the termination 10. The output termination 32 also serves as one plate of a capacitor with the portion 29 of the second termination 24 serving as the other plate of the capacitor. The capacitor formed by the portion 29 of the second termination 24 and the output termination 32 is electrically connected in series with the resistance element 20 by the second termination 24. Thus, there is provided on a single substrate 12 a capacitor electrically connected in series with a load resistor.

Figure 2:
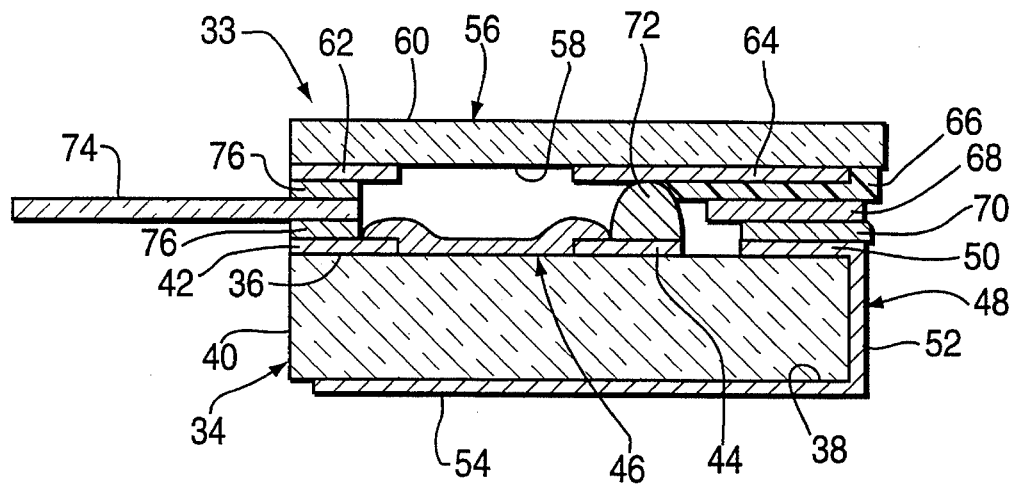
FIG. 2 is a sectional view of another form of the AC coupled termination of the present invention.

Referring to FIG. 2, another form of the AC termination of the present invention is generally designated as 33. Termination 33 comprises a substrate 34 of an insulating material, such as a ceramic, having first and second opposed surfaces 36 and 38 and an outer edge 40. On the first surface 36 of the substrate 34 are spaced first and second resistor terminations 42 and 44 of a film of a conductive metal. The first resistor termination 42 is adjacent the outer edge 40 of the substrate 34 and the second resistor termination 44 is spaced from the substrate outer edge 40 and adjacent the center of the substrate first surface 36. On the substrate first surface 36 is a resistance element 46 which extends between and makes ohmic contact with the resistor terminations 42 and 44. Resistance element 46 is a film of any desired resistance material. An output termination 48 of a layer of a conducive metal is on the substrate 34. The output termination 48 has a first portion 50 which extends over the substrate first surface 36, a second portion 52 which extends over the substrate outer edge 40 and a third portion 54 which extends over a portion of the substrate second surface 38. The third portion 54 of the output termination 48 is adjacent but spaced from the resistor second termination 44.

A cover plate 56 of a ceramic material extends over and is slightly spaced from the substrate first surface 36. The cover plate 56 has an inner surface 58 facing the substrate first surface 36, and an outer surface 60. On the inner surface 58 of the cover plate 56 is a termination layer 62 of a conductive metal. The termination layer 62 extends from an edge of the cover plate 56 only over the first resistor termination 42. An input capacitor electrode 64 of a layer of a conductive metal is on the inner surface 58 of the cover plate 56. The input capacitor electrode 64 extends from an edge of the cover plate inner surface 58 over the first portion 50 of the output termination 48 to over the second resistor termination 44. The input capacitor electrode 64 is spaced from the termination layer 62. A layer 66 of a dielectric material is on a portion of the input capacitor electrode 64 leaving the portion of the input capacitor electrode 64 which is over the second resistor termination 44 exposed. An output capacitor electrode 68 of a layer of a conductive metal is over the dielectric material layer 66.

A bump 70 of an electrically conductive solder is between the output capacitor electrode 68 and the first portion 50 of the output termination 48. A bump 72 of an electrically conductive solder is between the second resistor termination 44 and the input capacitor electrode 64. A metal terminal strip 74 has an end which is between the first resistor termination 42 and the termination layer 64. The terminal strip 74 projects beyond an edge of the substrate 34 and the cover plate 56. Solder 76 is between the terminal strip 74 and each of the first resistor termination 42 and the termination layer 62. The solder 70, 72 and 76 mechanically secures the cover plate 56 to the substrate 12. In addition, the solder bump 70 electrically connects the output capacitor electrode 68 to the output termination 48, and the solder bump 72 electrically connects the second resistor termination 44 to the input capacitor electrode 64. The solder 76 also mechanically secures the terminal strip 74 to the substrate 12 and electrically connects the terminal strip 74 to the first resistor termination 42.

Thus the AC termination 33 provides a resistor, formed by the resistance element 46, connected in series with a capacitor, formed by the capacitor electrodes 64 and 68 and the dielectric layer 66. The resistor-capacitor series is electrically connected between the input terminal strip 74 and the output termination 48.

Figure 3:
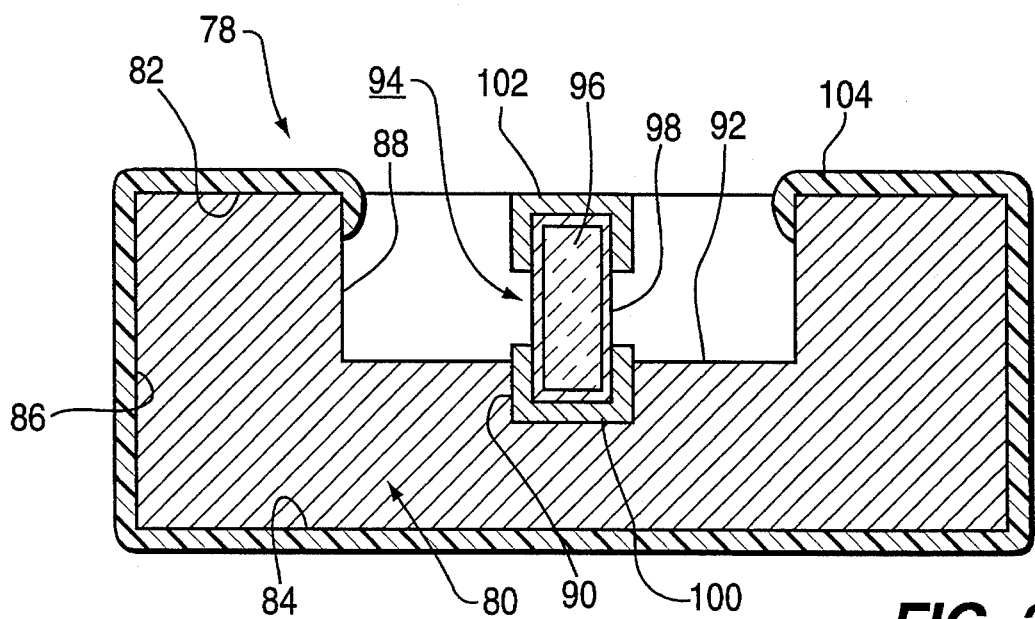
FIG. 3 is a sectional view of still another form of the AC coupled termination of the present invention.

Referring to FIG. 3, still another form of the AC termination of the present invention is generally designated as 78. AC termination 78 comprises a substrate 80 of a conductive metal having opposed first and second surfaces 82 and 84 and an outer periphery 86. The substrate 80 has a recess 88 in the center of the first surface 82. A shallow hole 90 is in the bottom surface 92 of the recess 88. A substantially cylindrical resistor 94 has one end within the hole 90. The resistor 94 is a cylindrical body 96 of an insulating material, such as a ceramic, having a layer 98 of a resistance material coated over its entire surface. The resistance material can be of any well known material, such as a metal film or a thick film of metal particles in a glass layer. The resistor 94 projects upwardly from the bottom 92 of the recess 88 and is preferably of a length such that it extends to the first surface 82 of the substrate 80. A metal output termination 100 is over the end of the resistor 94 which is within the hole 90 and mechanically and electrically connects the resistor 94 to the substrate 80. A metal input termination 102 is over the other end of the resistor 94. A layer 104 of a dielectric material is over the first surface 82, the outer periphery 86 and the second surface 84 of the substrate 80.

In the AC termination 78, the resistor 94 is electrically connected in series to one electrode of a capacitor, the substrate 80. The input termination 102 of the resistor 94 also serves as the input termination of the AC termination 78. The AC termination 78 is mounted on a metal device with the dielectric layer 104 being seated on and contacting the metal device. Thus, the metal device serves as the other electrode of the capacitor and the output termination of the AC termination 78.

Thus, there is provided by the present invention an AC termination which includes on a substrate a resistor connected in series with a capacitor. The AC termination of the present invention is small and compact and can be easily mounted on and electrically connected to the device with which it is to be used.

What is claimed is:

1. An AC termination comprising:

a substrate of an insulating material having first and second opposed surfaces and a peripheral edge;

a conductive input termination on the first surface of the substrate;

a conductive output termination over the second surface of the substrate;

a resistance element on said first surface of the substrate and having a pair of ends, one end of the resistance element being electrically connected to said input termination; and a capacitor on said substrate and electrically connected in series between the other end of the resistance element and the output termination.

2. The termination of claim 1 wherein the resistance element is a film of a resistance material on said first surface of the substrate.

3. The termination of claim 2 wherein a second conductive termination film is on the first surface of the substrate and is electrically connected to the other end of the resistance film, and the capacitor is electrically connected to said second termination film.

4. The termination of claim 3 wherein the second termination film extends across the peripheral edge of the substrate and over the second surface of the substrate to form one plate of the capacitor.

5. The termination of claim 4 wherein a layer of a dielectric material extends over the portion of the second termination film which is over the second surface of the substrate, and a layer of a conductive metal is over the dielectric material layer to form the other electrode of the capacitor and the output termination.

6. The termination of claim 3 including a cover plate of an insulating material extending over and secured to the first surface of the substrate, and the capacitor is on a surface of the cover plate which faces the first surface of the substrate.

7. The termination of claim 6 in which the capacitor comprises a first electrode of a film of a conductive metal on the said surface of the cover plate, a layer of a dielectric material over a portion of the first electrode and a second electrode of a conductive metal over the dielectric layer, the first electrode being electrically connected to the second termination on the substrate and the second electrode being electrically connected to the output termination.

8. The termination of claim 7 in which the output termination is a metal layer which extends over a portion of the first surface of the substrate, over the peripheral edge of the substrate and over the second surface of the substrate.

9. The termination of claim 8 in which the second electrode of the capacitor is over the portion of the output termination which is on the first surface of the substrate and is electrically connected to the output termination by a conductive metal solder.

10. The termination of claim 9 in which a portion of the first electrode of the capacitor extends across the second termination layer and is electrically connected to the second termination layer by a conductive metal solder.

11. The termination of claim 10 further comprising a metal termination strip electrically and mechanically connected at one end to the input termination, and projecting from the substrate.

* * * * *